United States Patent [19]

Dolan et al.

[11] Patent Number: 4,701,995

[45] Date of Patent: Oct. 27, 1987

[54] METHOD OF MAKING A NONPLANAR BURIED-HETEROSTRUCTURE DISTRIBUTED-FEEDBACK LASER

[75] Inventors: Gerald J. Dolan, Murray Hill; Ralph A. Logan, Morristown; Henryk Temkin, Berkeley Heights; Daniel P. Wilt, Scotch Plains, all of N.J.

[73] Assignee: American Telephone and Telegraph Company, AT&T Bell Laboratories, Murray Hill, N.J.

[21] Appl. No.: 924,518

[22] Filed: Oct. 29, 1986

[51] Int. Cl.$^4$ ............... H01L 21/66; H01L 21/208; H01L 21/36; H01S 3/19

[52] U.S. Cl. ............................ 437/129; 372/96; 204/192.34

[58] Field of Search .............. 29/569 L, 578, 572; 148/1.5; 372/44, 45, 66, 92, 96, 102; 156/643, 627; 204/192.1, 192.33, 192.34

[56] References Cited

U.S. PATENT DOCUMENTS

| | | | |
|---|---|---|---|
| 3,970,958 | 7/1976 | Streifer et al. | 372/96 |
| 3,970,959 | 7/1976 | Wang et al. | 372/96 |
| 4,207,122 | 6/1980 | Goodman | 29/569 L |
| 4,248,688 | 2/1981 | Gartner et al. | 204/192.34 |
| 4,278,493 | 7/1981 | Petvai | 204/192.34 |
| 4,407,933 | 10/1983 | Fraser et al. | 204/192.34 |
| 4,504,952 | 3/1985 | Hartman et al. | 372/45 |
| 4,509,996 | 4/1985 | Greene et al. | 29/569 L |
| 4,523,971 | 6/1985 | Cuomo et al. | 204/192.34 |
| 4,559,901 | 12/1985 | Morimoto et al. | 204/192.1 |
| 4,561,915 | 12/1985 | Mito | 29/569 L |
| 4,573,255 | 3/1986 | Gordon et al. | 29/569 L |
| 4,595,454 | 6/1986 | Dautremont-Smith | 156/647 |
| 4,613,387 | 9/1986 | Turley | 29/569 L |
| 4,620,898 | 11/1986 | Banks et al. | 156/643 |
| 4,631,802 | 12/1986 | Hagashi et al. | 29/569 L |
| 4,633,876 | 12/1986 | Scifres et al. | 372/96 |
| 4,642,145 | 2/1987 | Connolly et al. | 29/569 L |

FOREIGN PATENT DOCUMENTS 58-194385 11/1983 Japan.
60-213074 10/1985 Japan.

OTHER PUBLICATIONS

*Appl. Phys. Lett.*, vol. 18, No. 4 (1971); "Stimulated Emission in a Period Structure" by H. Kogelnik et al., pp. 152–154.

*J. Appl. Phys.* 43, 5, May 1972, pp. 2327–2335 "Coupled-Wave Theory of Distributed Feedback Lasers" by H. Kogelnik et al.

IEEE *J. of Quantum Electronics,* vol. QE-12, No. 12, Oct. 1976, "Lasing Characteristics of Distributed-Feedback GaAs-GaAlAs Diode Lasers with Separate Optical and Carrier Confinement" by Kunio Aiki et al.

*Nuclear Instruments and Methods* 62 (1968), pp. 306–310, "Laser Linac with Grating" by Y. Takeda et al.

"Room-temperature CW Operation of Distributed-feedback Buried-heterostructure InGaAsP-/InP Lasers Emitting at 1.57 micrometer", *Electronics Letters*, vol. 17 (1981), pp. 961–963, by K. Utaka et al.

"Room-temperature CW Operation of 1.3 micrometer Distributed-feedback GaInAsP/InP Lasers", *Electronics Letters*, vol. 18 (1982), pp. 857–858, by Y. Uematsu et al.

"CW Operation of DFB-BH GaInAsP/InP Lasers in 1.5 micrometer Wavelength Region", *Electronics Letters*, vol. 18 (1982), pp. 27–28, by T. Matsuoka et al.

(List continued on next page.)

*Primary Examiner*—Brian E. Hearn
*Assistant Examiner*—Chi-Tso Huang
*Attorney, Agent, or Firm*—Peter A. Businger

[57] ABSTRACT

A buried-heterostructure distributed feedback laser is described, including a grating structure at a surface of a nonplanar cladding layer. The grating structure can be made by transfer of a pattern by ion milling, the pattern being defined in an ion-beam resist layer, e.g., by direct-writing electron-beam exposure. Low-threshold, high-power lasers are obtained with a commercially favorable yield.

5 Claims, 3 Drawing Figures

OTHER PUBLICATIONS

"High-quality InP Surface Corrugations for 1.55 micrometer InGaAsP DFB Lasers Fabricated Using Electron-beam Lithography", *Electronics Letters*, vol. 18 (1982), pp. 863-865, by L. D. Westbrook et al.

"Deformation-free Overgrowth of InGaAsP DFB Corrugations", *Electronics Letters*, vol. 19 (1983), pp. 34-36, by A. W. Nelson et al.

"High-power Single-longitudinal-mode Operation of 1.3 micrometer DFB-DC-PBH LD", *Electronics Letters*, vol. 19 (1983), pp. 840-841, by M. Kitamura et al.

"Low-threshold and High-temperature Single-longitudinal-mode Operation of 1.55 micrometer-band DFB-DC-PBH LDs", *Electronics Letters*, vol. 20 (1984), pp. 595-596, by M. Kitamura et al.

"1.55 micrometer Multisection Ridge Lasers", *Electronics Letters*, vol. 19 (1983), pp. 523-525, by J. E. Bowers et al.

"Continuous-wave Operation of 1.5 $\mu$m Distributed-Feedback Ridge-Waveguide Lasers", *Electronics Letters*, vol. 20, (1984), pp. 225-226, by L. D. Westbrook et al.

"1.55-micrometer InGaAsP Ridge Waveguide Distributed Feedback Laser", *Applied Physics Letters*, vol. 45 (1984), pp. 1178-1180, by H. Temkin et al.

"Heteroepitaxial Ridge-overgrown Distributed Feedback Laser at 1.5 micrometer", *Applied Physics Letters*, vol. 45 (1984), pp. 1272-1274, by W. T. Tsang et al.

"Ridge Waveguide Distributed Feedback Lasers with Electron Beam Defined Gratings", *Applied Physics Letters*, vol. 46 (1985), pp. 105-107, by H. Temkin et al.

"A Novel GaInAsP/InP Distributed Feedback Laser", *Applied Physics Letters*, vol. 46 (1985), pp. 221-223, by Z. L. Liau et al.

"V-grooved Substrate Buried Heterostructure InGaAsP/InP Laser", *Electronics Letters*, vol. 17 (1981), pp. 465-467, by H. Ishikawa et al.

"InGaAsP/InP (1.3 micrometer) Buried-crescent Lasers with Separate Optical Confinement", *Electronics Letters*, vol. 18 (1982), pp. 895-896, by R. A. Logan et al.

"Quaternary 1.5 micrometer (InGaAsP/InP) Buried Crescent Lasers with Separate Optical Confinement", *Electronics Letters*, vol. 19 (1983), pp. 113-115, by J. F. Van Der Ziel et al.

"Channelled-substrate Buried Heterostructure InGaAsP/InP Lasers with Vapor Phase Epitaxial Base Structure and Liquid Phase Epitaxial Regrowth", *Journal of Applied Physcis*, vol. 56 (1984), pp. 710-712, by D. P. Wilt et al.

"Second-order Distributed Feedback Lasers with Mode Selection Provided by First-order Radiation Losses", *IEEE Journal of Quantum Electronics*, vol. QE-21 (1985), pp. 144-150, by R. F. Kazarinov et al.

METHOD OF MAKING A NONPLANAR BURIED-HETEROSTRUCTURE DISTRIBUTED-FEEDBACK LASER

TECHNICAL FIELD

The invention is concerned with solid state lasers and, in particular, with buried-heterostructure lasers.

BACKGROUND OF THE INVENTION

In the development of high-capacity optical communications systems the use of highly mode-selective monochromatic light sources is desirable, and semiconductor lasers are being considered as particularly suitable in this respect. In particular, and with a view towards potentially superior mode selectivity, there is strong interest in semiconductor lasers in which feedback is produced at least in part by a grating arrangement.

Lasers in which feedback is produced by a grating have become known as dynamic single-mode (DSM) lasers, and these, in turn, are classified as distributed-Bragg-reflector (DBR) or distributed-feedback (DFB) lasers depending on placement of the grating: in the case of a DBR laser the grating forms a part of a waveguide adjoining the active region in a direction of light propagation; in the case of a DFB laser the grating is alongside the active region. In the following, attention is directed primarily to DFB lasers.

One possible structure for a distributed-feedback laser comprises a grating which is formed on a substrate prior to the deposition of waveguiding and active layers; see, e.g., K. Utaka et al., "Room-temperature CW Operation of Distributed-feedback Buried-heterostructure InGaAsP/InP Lasers Emitting at 1.57 micrometer", *Electronics Letters*, Vol. 17 (1981), pp. 961–963;

Y. Uematsu et al. "Room-temperature CW Operation of 1.3 micrometer Distributed-feedback GaInAsP/InP Lasers", *Electronics Letters*, Vol. 18 (1982), pp. 857–858;

T. Matsuoka et al., "CW Operation of DFB-BH GaInAsP/InP Lasers in 1.5 micrometer Wavelength Region", *Electronics Letters*, Vol. 18 (1982), pp. 27–28; and L. D. Westbrook et al., "High-quality InP Surface Corrugations for 1.55 micrometer InGaAsP DFB Lasers Fabricated Using Electrion-beam Lithography", *Electronics Letters*, Vol. 18 (1982), pp. 863–865.

An alternate approach to the formation of a grating consists in forming a grating after deposition of the active layer, followed by cladding layer deposition. This approach has become known as "overgrowth" and is exemplified by the following:

A. W. Nelson et al., "Deformation-free Overgrowth of InGaAsP DFB Corrugations", *Electronics Letters*, Vol. 19 (1983), pp. 34–36;

M. Kitamura et al., "High-power Single-longitudinal-mode Operation of 1.3 micrometer DFB-DC-PBH LD", *Electronics Letters*, Vol. 19 (1983), pp. 840–841; and M. Kitamura et al., "Low-threshold and High-temperature Single-longitudinal-mode Operation of 1.55 micrometer-band DFB-DC-PBH LDs", *Electronics Letters*, Vol. 20 (1984), pp. 595–596.

In a variant approach, overgrowth is partially etched away to produce a so-called ridge structure which serves for lateral mode confinement. The following items are representative with respect to this approach:

J. E. Bowers et al., "1.55 micrometer Multisection Ridge Lasers", *Electronics Letters*, Vol. 19 (1983), pp. 523–525;

L. D. Westbrook et al., "Continuous-wave Operation of 1.5-micrometer Distributed-feedback Ridge-waveguide Laser", *Electronics Letters*, Vol. 20 (1984), pp. 225–226;

H. Temkin et al., "1.55-micrometer InAsAsP Ridge Waveguide Distributed Feedback Laser", *Applied Physics Letters*, Vol. 45 (1984), pp. 1178–1180;

W. T. Tsang et al., "Heteroepitaxial Ridge-overgrown Distributed Feedback Laser at 1.5 micrometer", *Applied Physics Letters*, Vol. 45 (1984), pp. 1272–1274; and H. Temkin et al., "Ridge Waveguide Distributed Feedback Lasers with Electron Beam Defined Gratings", *Applied Physics Letters*, Vol. 46 (1985), pp. 105–107.

While the above-cited items disclose feedback gratings which are placed in close proximity to the active region, it has also been possible, by means of x-ray lithography and ion-beam-assisted etching, to form a grating in a cladding layer as disclosed by Z. L. Liau et al., "A Novel GaInAsP/InP Distributed Feedback Laser", *Applied Physics Letters*, Vol. 46 (1985), pp. 221–223.

One structural feature which is shared by the above-cited items lies in the uniform flatness of layers which make up the disclosed semiconductor lasers. This is contrasted with considerable departure from flatness in the case of semiconductor lasers variously designated as V-groove, buried-crescent, or channeled-substrate lasers and as disclosed, e.g., in the following:

H. Ishikawa et al., "V-grooved Substrate Buried Heterostructure InGaAsP/InP Laser", *Electronics Letters*, Vol. 17 (1981), pp. 465–467;

R. A. Logan et al., "InGaAsP/InP (1.3 micrometer) Buried-crescent Lasers with Separate Optical Confinement", *Electronics Letters*, Vol. 18 (1982), pp. 895–896;

J. P. Van Der Ziel et al., "Quaternary 1.5 micrometer (InGaAsP/InP) Buried Crescent Lasers with Separate Optical Confinement", *Electronics Letters*, Vol. 19 (1983), pp. 113–115; and D. P. Wilt et al., "Channeled-substrate Buried Heterostructure InGaAsP/InP Lasers with Vapor Phase Epitaxial Base Structure and Liquid Phase Epitaxial Regrowth", *Journal of Applied Physics*, Vol. 56 (1984), pp. 710–712.

Laser qualities such as, e.g., low threshold and high output power, and established high-yield manufacturing procedures are among factors favoring the use of V-groove buried-heterostructure lasers in optical communications systems. However, such lasers so far have been made only with a Fabry-Perot cavity and, indeed, V-groove structure has been considered as incompatible with the requirements of distributed feedback. Specifically, due to steeply sloping sidewalls, the placement of a grating in the substrate beneath waveguiding and active layers would appear to be difficult indeed. Also, while layer deposition results in a certain amount of filling of the V-groove, layer surfaces remain far from level; moreover, the thickness of deposited layers is nonuniform, with considerably greater thickness along the center line than towards the walls of the V-groove. In view of lack of planarity and nonuniformity of thickness, making a grating after deposition of the active layer would seem to require precise control over the depth of grating grooves—a requirement which remains unmet by practicable methods of manufacture.

SUMMARY OF THE INVENTION

A buried-heterostructure laser is made including a distributed-feedback grating which is formed subsequent to epitaxial deposition of a waveguiding structure. Such grating is formed on a nonplanar surface of a cladding layer subsequent to deposition of an active layer.

DETAILED DESCRIPTION

Figure 1:
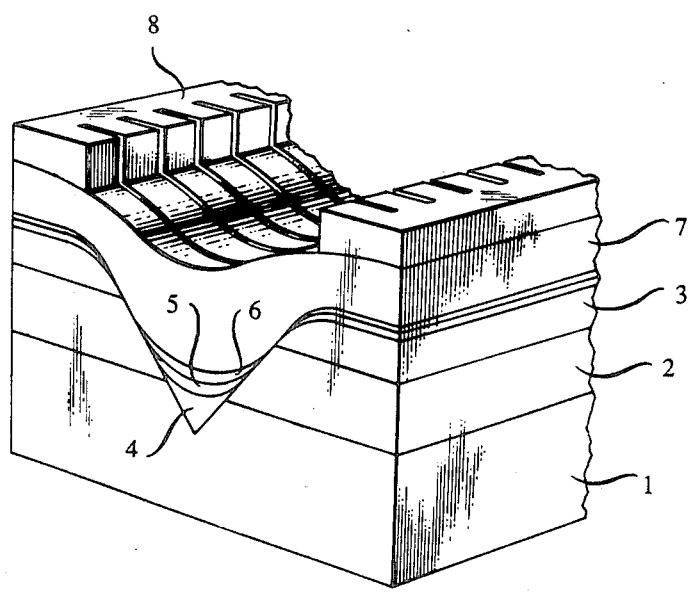
FIG. 1 shows schematically and greatly enlarged an embodiment of a distributed-feedback buried-crescent heterostructure laser in accordance with the invention.

The Figure shows substrate 1, typically including a deposited buffer layer of n-indium phosphide, a p-indium phosphide layer 2, and an n-indium phosphide layer 3. These layers are typically deposited by liquid phase epitaxial growth, and deposition is followed by etching of a V-groove and subsequent back-filling by deposition of n-indium phosphide layer 4, n-indium gallium arsenide phosphide active layer 5, n-indium gallium arsenide phosphide layer 6, p-indium phosphide layer 7. A subsequently deposited $p^+$-indium gallium arsenide phosphide contact layer 8 is shown partly etched away, and distributed feedback grating grooves are shown on cladding layer 7 and partly on the contact layer 8.

The disclosed laser structure is such that the laser active layer 5 is surrounded by semiconductor material having a smaller dielectric constant and a larger bandgap, and such that a reverse-biased p-n-p junction is formed by layers 2, 3, and 7. Upon application of a suitable voltage to electrode attached to the bottom of substrate 1 and to the top of contact layer 8, current flow is essentially limited to the active layer. Alternatively, and as disclosed in patent application Ser. No. 621,071, filed June 15, 1984 to W. D. Johnston, Jr. et al., current confinement can be achieved by means of an Fe-doped InP-based layer.

While, for economic reasons, liquid-phase epitaxial deposition of layers is favored, other deposition methods such as, e.g., vapor-phase epitaxial deposition are not precluded. The grating grooves in cladding layer 7 can be made by ion milling of a pattern which has been lithographically defined in a suitable resist material. Since the surface of layer 7 is nonplanar (slightly concave), depth of focus of an optical beam may be inadequate for pattern definition and, on account of superior depth of focus of an electron beam, electron-beam direct writing is preferred for this purpose.

Electron-beam direct writing has been found to be readily adaptable to commercial production at high levels of yield. Alternatively, a grating can be made by ion-beam direct writing, obviating the need for deposition and development of a resist material.

The grating may remain exposed to air as shown in FIG. 1; alternatively, a conductive or dielectric material may be deposited after the grating has been defined. (A dielectric material can serve for passivation and protection; a conductive material can serve to enhance electrical contact to the device.)

Figure 2:
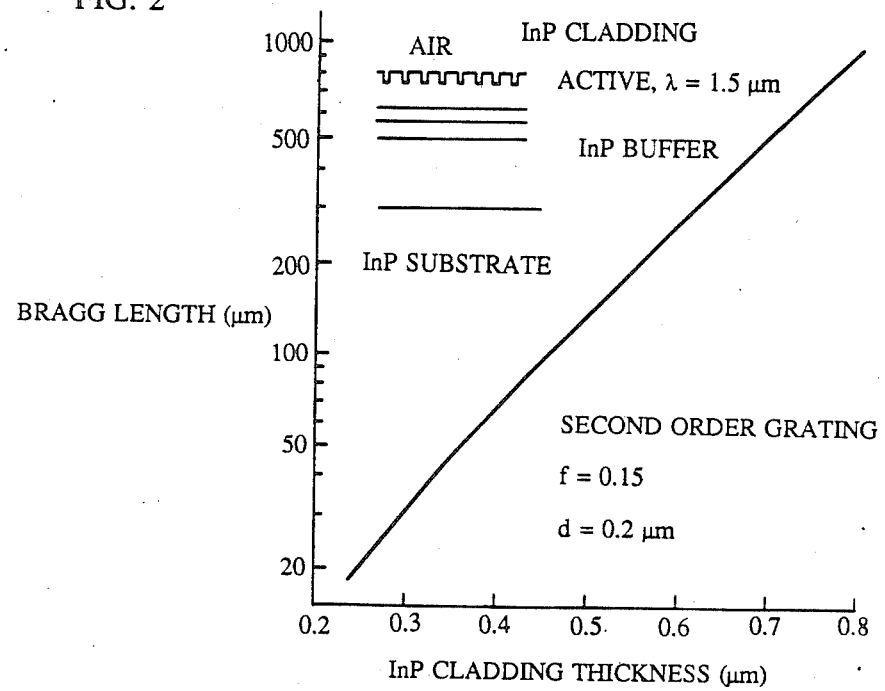
FIG. 2 represents a functional relationship between cladding layer thickness and Bragg length as determined by an approximate calculation.
Figure 3:
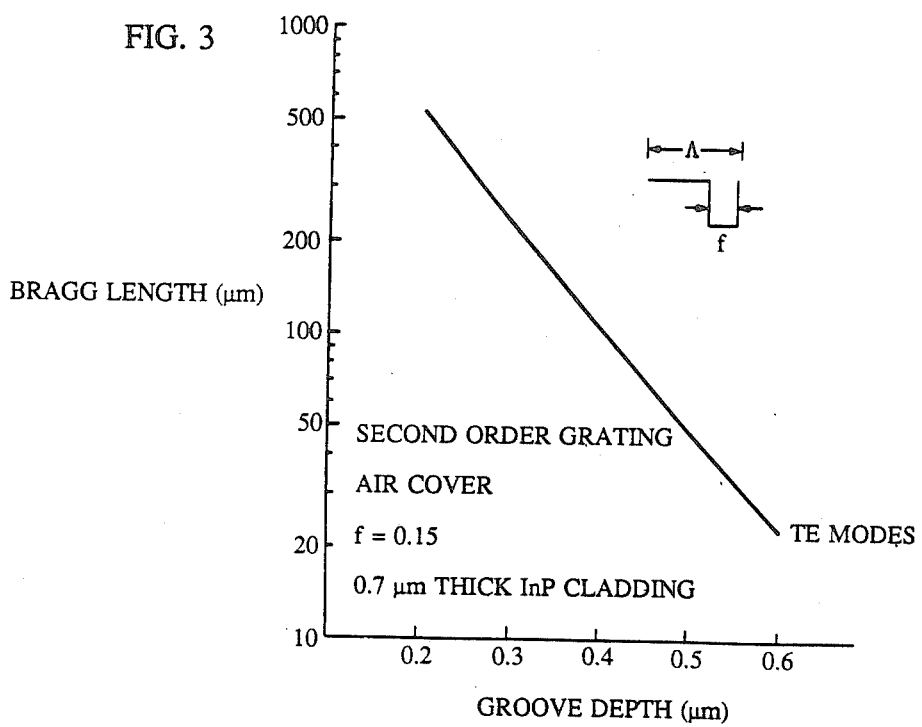
FIG. 3 represents a functional relationship between grating depth and Bragg length as determined by an approximate calculation.

Coupling strength of gratings at a cladding-air interface of a distributed-feedback laser can be appreciated by reference to FIGS. 2 and 3 which represent the results of approximate calculations based on a model proposed by R. F. Kazarinov et al., "Second-order Distributed Feedback Lasers with Mode Selection Provided by First-order Radiation Losses", *IEEE Journal of Quantum Electronics,* Vol. QE-21 (1985), pp. 144–150. For these calculations, a simplified laser structure was assumed, including an indium phosphide substrate with buffer layer, an indium phosphide cladding layer having a thickness in the range from 0.25 to 1.0 micrometer, an indium gallium arsenide phosphide active layer having a thickness of 0.2 micrometer, and a second-order grating in an indium phosphide cladding layer. A 15-percent portion of the period of the grating was allocated to the groove.

Bragg length presented in FIG. 2 was obtained as a function of the thickness of the indium phosphide cladding layer assuming a constant grating depth of 0.2 micrometer. It can be seen from FIG. 2 that, as the thickness of the indium phosphide layer increases from 0.25 to 0.8 micrometer, Bragg length increases from approximately 20 micrometers to over 1000 micrometers. Since, in the interest of low threshold current and high modal purity of laser output radiation, the length of the laser cavity should be at least twice the Bragg length, the preferred Bragg length would be approximately 150 micrometers or less in the case of a typical semiconductor laser having a cavity length of approximately 300 micrometers. It is thus possible to realize satisfactory distributed-feedback laser performance with a cladding layer thickness of approximately 0.5 micrometer for the assumed grating.

The relationship between Bragg length and grating depth is shown in FIG. 3 for TE-modes and for a fixed cladding layer thickness of 0.7 micrometer, other assumptions being as described above. It is apparent from FIG. 3 that gratings deeper than approximately 0.35 micrometer are suitable for efficient distributed-feedback laser operation in this case. Combinations of still thicker indium phosphide cladding layers and deeper gratings, as appear achievable in most laser structures, may offer reliability advantages.

Calculations as summarized above support expectations of good coupling of laser radiation to the grating, and evidence of such coupling was experimentally obtained from the laser made as described in the Example below. Among practical advantages of lasers in accordance with the invention are low threshold current and good device yields even though the grating is fully integrated into the laser structure. Also, lasers of the invention have high modal purity, such purity being comparable to the best results ever reported for distributed-feedback lasers.

While the Example as well as the calculations involved a second-order grating, use of a first-order grating is not precluded. (The application of a first-order grating may require manufacturing care. However, a first-order grating can be expected to have greater coupling strength as compared with a second-order grating. As a result, sufficient coupling strength may be produced with a first order grating which has reduced groove depth or which is placed at a greater distance from the active region.)

Example

V-groove lasers were made as schematically shown in FIG. 1 and having the following layer thicknesses and dopant concentrations:

A buffer layer (1) doped with approximately $5 \times 10^{17}/cm^3$ Sn and having a thickness of approximately 10 micrometers, a p-layer (2) doped with approximately $10^{17}/cm^3$ Zn and having a thickness of approximately 2 micrometers, and an n-layer (3) doped with approximately $5 \times 10^{17}/cm^3$ Sn and having a thickness of approximately 2 micrometers.

The V-groove was etched approximately 4 to 5 micrometers deep and having (111) B-oriented sidewalls. This was effected by exposure to a mixture of 3 parts by volume hydrochloric acid and 1 part by volume phosphoric acid for approximately 20 seconds, exposure being through a 2-micrometer-wide window in a thermally deposited silica etch mask as described in U.S. Pat. No. 4,595,454, issued June 17, 1986 to W. C. Dautremont-Smith et al.

After cleaning and stripping of silica in hydrofluoric acid, the laser structure was made by growing layers 4, 5, 6, 7, and 8 shown in FIG. 1. (It is a characteristic of liquid-phase epitaxial deposition that initial deposits fill in the groove, while very little material is deposited on the V-groove wall proper. As a result, deposited layers 5 and 6 have crescent-shaped cross section in the V-groove.)

Another silica etch mask was then deposited on contact layer 8 and photolithographically defined to provide for a 3-micrometer-wide window over the active layer. Etching through the contact layer to expose the window portion of the cladding layer was by means of a mixture of 4 parts by volume sulfuric acid, 1 part by volume water, and 1 part by volume 30-percent hydrogen peroxide solution. Etch time was approximately 30 seconds.

For the production of a grating, the exposed cladding layer surface was coated with a thin layer of photoresist which was hardened by baking at a temperature of approximately 200 degrees C. for approximately one hour, and the hardened layer was covered with a 0.2-micrometer-thick layer of a standard electron beam resist material, polymethyl methacrylate (PMMA). A second-order grating pattern was delineated by means of a JEOL Model JBX-5D electron beam writing tool; the width of the grating was approximately 50 micrometers and its period approximately 4600 Angstroms. From 15 to 30 percent of the grating period was exposed, as corresponding to the groove portion of the pattern. The electron-exposed resist layer was developed, and the developed pattern was transferred into the underlying cladding layer by means of exposure to a beam of argon ions, resulting in a groove depth of approximately 0.3 micrometer. The grating was covered with a thin layer of silica, and a metallization layer was applied across the resulting surface.

Device operation exhibited a continuous-wave threshold in the range from 40 to 70 mA and an external quantum efficiency in the approximate range of 12 to 16 percent per facet. At a wavelength of approximately 1.5 micrometer, and up to an output power of 10 mW, the light output was essentially linear as a function of electrical current. Only TE-polarization was observed, and the longitudinal mode spectrum was dominated by a single, narrow distributed feedback mode. (At a current of 1.5 threshold current, and corresponding power output of 4.5 mW, the mode rejection ratio was greater than 5000 to 1.) In the current range up to 2.3 threshold current, emission wavelength changed by not more than 11 to 12 Angstroms, corresponding to a chirp rate of not more than approximately 0.1 Angstrom/mA.

The modulation bandwidth of the laser was tested with 5 mA peak-to-peak sinusoidal modulation, and a $-3$ dB modulation bandwidth of approximately 1 GHz was measured at a bias current of approximately 1.05 threshold current. Above 1.35 threshold current, the modulation bandwidth exceeded 1.5 GHz.

What is claimed is:

1. Method for making a distributed feedback laser, said method comprising forming a buried heterostructure on a substrate by sequential deposition of layers including an active layer and a cladding layer, said method comprising a step of producing a grating structure on a nonplanar surface of said cladding layer.

2. Method of claim 1 in which said grating structure is produced by transfer of a pattern defined in a resist layer on said surface.

3. Method of claim 2 in which said structure is defined by electron-beam direct writing in said resist layer.

4. Method of claim 2 in which said structure is made by transfer of said pattern by ion-beam milling.

5. Method of claim 1 in which said structure is produced by ion-beam direct writing in said cladding layer.

* * * * *